United States Patent

Kurauchi et al.

[11] Patent Number: 5,959,469
[45] Date of Patent: Sep. 28, 1999

[54] CHOPPER COMPARATOR SHOWING HIGH SPEED AND LOW POWER OPERATIONS FREE OF MALFUNCTION UNDER VARIATION OF LOGICAL THRESHOLD VOLTAGE OF INVERTOR

[75] Inventors: Akira Kurauchi; Akira Yukawa, both of Tokyo, Japan

[73] Assignee: NEC Corporation, Tokyo, Japan

[21] Appl. No.: 08/934,558

[22] Filed: Sep. 22, 1997

[30] Foreign Application Priority Data

Sep. 20, 1996 [JP] Japan ................................ 8-249630

[51] Int. Cl.[6] .......................... H03K 5/153; G06G 7/64
[52] U.S. Cl. ................................ 327/77; 327/93; 327/337
[58] Field of Search .......................... 330/9, 51; 327/77, 327/79, 337, 91, 93

[56] References Cited

U.S. PATENT DOCUMENTS

| | | | |
|---|---|---|---|
| 5,113,090 | 5/1992 | Imaizumi et al. | 307/355 |
| 5,142,238 | 8/1992 | White | 330/9 |
| 5,262,686 | 11/1993 | Kurosawa | 327/77 |
| 5,329,187 | 7/1994 | Crispie et al. | 307/494 |
| 5,332,931 | 7/1994 | Crispie et al. | 307/355 |
| 5,410,270 | 4/1995 | Rybicki et al. | 330/9 |
| 5,546,028 | 8/1996 | Yamaguchi | 327/91 |

FOREIGN PATENT DOCUMENTS 0 363 332   4/1990   European Pat. Off. .

OTHER PUBLICATIONS

Lewis et al., "Session XVII: Analog Techniques" *IEEE International Solid State Circuits Conference* 30:210–211 and 405 (1987).

Matsuura et al., "Session XV: A/D conversion" *IEEE International Solid State Circuits Conference* 31:220–221 and 376 (1988).

Dingwall et al. IEEE Journal of Solid State Circuit, vol. SC–20, No. 6, Dec. 1985, pp. 1138–1143.

*Primary Examiner*—Toan Tran
*Attorney, Agent, or Firm*—Foley & Lardner

[57] ABSTRACT

A chopper comparator for comparing an analog input signal voltage and a comparative reference voltage comprises the following elements. First and second input terminals are provided for receiving the analog input signal voltage and the comparative reference voltage respectively. A first capacitor is provided with a first input side terminal connected through a first switch to the first input terminal. A second capacitor is provided with a second input side terminal connected through a second switch to the second input terminal. A data latch circuit is provided and is connected to first and second output terminals of the first and second capacitors. A third switch is provided between the first and second input side terminals of the first and second capacitors, wherein after the first and second switches have turned OFF to discontinue applications of the analog input signal voltage and the comparative reference voltage to the first and second capacitors respectively, the third switch turns ON to form a short circuit between the first and second input side terminals of the first and second capacitors.

11 Claims, 6 Drawing Sheets

CHOPPER COMPARATOR SHOWING HIGH SPEED AND LOW POWER OPERATIONS FREE OF MALFUNCTION UNDER VARIATION OF LOGICAL THRESHOLD VOLTAGE OF INVERTOR

BACKGROUND OF THE INVENTION

The present invention relates to a chopper comparator formed in a semiconductor integrated circuit, and more particularly to a chopper comparator showing high speed and low power operations free of malfunction under variation of a logical threshold voltage of an invertor.

The chopper comparator has been used as a voltage comparator for an analog-to-digital converter for converting analog signals to digital signals. The chopper comparator judges whether a voltage level of analog signals inputted is higher or lower than a comparative reference voltage. One of the chopper comparators is disclosed in IEEE Journal of Solid State Circuit, Vol. SC-20, No. 6, pp. 1138–1143, December 1985.

A conventional chopper comparator will be described with reference to FIGS. 1 and 2. FIG. 1 is a circuit diagram illustrative of the conventional chopper comparator. FIG. 2 is a timing chart illustrative of signal waveforms of the conventional chopper comparator. The conventional chopper comparator has two input terminals 8 and 9. An analog input voltage Vin is applied to the input terminal 8. A comparative reference voltage Vref is applied to the input terminal 9. The input terminal 8 is connected through a first switch 1 to a first capacitor C21. The input terminal 9 is connected through a second switch 2 to the first capacitor C21. The first capacitor C21 is applied either the analog input voltage Vin or the reference voltage Vref. The conventional chopper comparator has a first invertor 23 having an input terminal connected to the first capacitor C21. The conventional chopper comparator has a second capacitor C22 connected to an output terminal of the first invertor 23. A third switch 19 is provided between the input and output terminals of the first invertor 23 so that the third switch 19 and the first invertor 23 are connected in parallel to each other to the first capacitor C21. A second invertor 24 is provided having an input terminal connected to the second capacitor C22. A fourth switch 20 is provided between input and output terminals of the second invertor 24 so that the fourth switch 20 and the second invertor 24 are connected in parallel to each other to the second capacitor C22. A data latch circuit 12 is provided having an input terminal connected to the output terminal of the second invertor 24. The conventional chopper comparator has an output terminal 15 connected to an output terminal of the data latch circuit 12. An output voltage Dout appears on the output terminal 15 as a result of the comparison of the input analog signal voltage level to the comparative reference voltage level.

Operations of the above conventional chopper comparator will subsequently be described with reference to FIG. 2. The operations of the above conventional chopper comparator may be considered to be divided into two time periods, for example, first and second time periods. In the first time period, the first, third and fourth switches 1, 19 and 20 are in ON state whilst the second switch 2 is in OFF state. Since the first switch 1 is in ON state, the analog input signal voltage Vin is applied through the first switch 1 to the first capacitor C21. A first short circuit is formed by the third switch 19 between the input and output terminals of the first invertor 23. A second short circuit is also formed by the fourth switch 20 between the input and output terminals of the second invertor 24. The first invertor 23 outputs an output voltage corresponding to the logical threshold voltage VLT23 as an operational point at which input and output voltages of the first invertor 23 are balanced. The second invertor 24 outputs an output voltage corresponding to the logical threshold voltage VLT24 as an operational point at which input and output voltages of the second invertor 24 are balanced. The analog input signal voltage Vin is applied to an input side terminal of the first capacitor C21. The logical threshold voltage VLT23 is generated on an output side terminal of the first capacitor C21. Since the third switch 19 is in ON state, the logical threshold voltage VLT23 is also applied to an input side terminal of the second capacitor C22. The logical threshold voltage VLT24 is generated on an output side terminal of the second capacitor C22. The first capacitor C21 is biased by a voltage corresponding to a difference between the analog input signal voltage Vin and the logical threshold voltage VLT23. The first capacitor C21 is charged in accordance with the difference between the analog input signal voltage Vin and the logical threshold voltage VLT23. The second capacitor C22 is also biased by a voltage corresponding to a difference between the logical threshold voltages VLT23 and VLT24. The second capacitor C22 is charged in accordance with the difference between the logical threshold voltages VLT23 and VLT24. Even if the first and second invertors 23 and 24 are designed to be identical with each other, the logical threshold voltages VLT23 and VLT24 somewhat differ from each other due to unavoidable variations on fabrication processes for the semiconductor integrated circuits. For that reason, the second capacitor C22 is charged in accordance with the difference between the logical threshold voltages VLT23 and VLT24.

In the second time period, the first, third and fourth switches 1, 19 and 20 turn OFF whilst the second switch 2 turns ON. The comparative reference voltage Vref is applied through the second switch 2 to the first capacitor C21. If the analog input signal voltage Vin is higher than the comparative reference voltage Vref, this means that the voltage applied to the input side terminal of the first capacitor C21 is dropped from the analog input signal voltage Vin to the comparative reference voltage Vref. The drop of the voltage level or the potential of the input side terminal of the first capacitor C21 causes a potential drop on the output side terminal of the first capacitor C21 in accordance with the principle of conservation of charge. Namely, the potential of the output side terminal of the first capacitor C21 is, for example, dropped from the logical threshold voltage VLT23 to a voltage VLT23' provided that Vin−VLT23=Vref−VLT23'. The potential of the input terminal of the first invertor 23 is also dropped from the logical threshold voltage VLT23 to the voltage VLT23'. The potential drop on the input terminal of the first invertor 23 causes a rise of the potential of the output terminal of the first invertor 23. The rise of the potential of the output terminal of the first invertor 23 causes a rise of the potential of the input side terminal of the second capacitor C22. The rise of the potential of the input side terminal of the second capacitor C22 causes a rise of the potential of the output side terminal of the second capacitor C22. The rise of the potential of the output side terminal of the second capacitor C22 causes a rise of the potential of the input terminal of the second invertor 24. The rise of the potential of the input terminal of the second invertor 24 causes a drop of the potential of the output terminal of the second invertor 24. The output voltage from the second invertor 24 is then fetched by the data latch circuit 12 before the output voltage from the second invertor 24 is converted into logic levels to be outputted onto the output terminal 15 as the result of the comparison of the analog input signal voltage to the comparative reference voltage.

If, however, the analog input signal voltage Vin is lower than the comparative reference voltage Vref, this means that the voltage applied to the input side terminal of the first capacitor C21 has risen from the analog input signal voltage Vin to the comparative reference voltage Vref. The rise of the voltage level or the potential of the input side terminal of the first capacitor C21 causes a potential rise on the output side terminal of the first capacitor C21 in accordance with the principle of conservation of charge. Namely, the potential of the output side terminal of the first capacitor C21 is, for example, risen from the logical threshold voltage VLT23 to a voltage VLT23' provided that Vin−VLT23=Vref−VLT23'. The potential of the input terminal of the first invertor 23 is also risen from the logical threshold voltage VLT23 to the voltage VLT23'. The potential rise on the input terminal of the first invertor 23 causes a drop of the potential of the output terminal of the first invertor 23. The drop of the potential of the output terminal of the first invertor 23 causes a drop of the potential of the input side terminal of the second capacitor C22. The drop of the potential of the input side terminal of the second capacitor C22 causes a drop of the potential of the output side terminal of the second capacitor C22. The drop of the potential of the output side terminal of the second capacitor C22 causes a drop of the potential of the input terminal of the second invertor 24. The drop of the potential of the input terminal of the second invertor 24 causes a rise of the potential of the output terminal of the second invertor 24. The output voltage from the second invertor 24 is then fetched by the data latch circuit 12 before the output voltage from the second invertor 24 is converted into logic levels to be outputted onto the output terminal 15 as the result of the comparison of the analog input signal voltage to the comparative reference voltage.

FIG. 3 is a diagram illustrative of input output characteristics L1 and output characteristics L2 and L3 of the invertor in the above conventional chopper comparator. The input-output characteristics for the logical threshold voltage of the invertor are represented by a line L1. The output characteristic of the invertor when supplied with a power voltage of VDD is represented by a curve L2. The output characteristic of the invertor when supplied with a power voltage of VDD' is represented by a curve L3. If the power voltage is VDD in the first time period and then unintentionally dropped to a voltage VDD' in the second time period, then the logical threshold voltage VLT (point A) having been in the first time period is also dropped to a voltage VLT' (point B). The output characteristic L2 having been in the first time period is also changed to the output characteristic L3. If the input voltage to be inputted to the invertor remains corresponding to the logical threshold voltage VLT through the first and second time periods, then the output voltage from the invertor corresponds to the point A on the output voltage curve L2 in the first time period and then is dropped to a voltage corresponding to the point C on the output voltage curve L3 in the second time period.

If for example, the input voltage to be inputted into the invertor corresponds to the point A in the first time period before the input voltage is dropped to correspond to the point D due to the variation of the logical threshold voltage by the power voltage drop, then the output voltage from the invertor corresponds to the point D2 on the curve L3. If, however, no power voltage drop appears, then the output voltage corresponds to the point D1 on the curve L2. Namely, if the power voltage drop appears, the result of the comparison of the analog input signal voltage to the comparative reference voltage is opposite to the correct one. If the power voltage drop appears, the malfunction of the chopper comparator may appear.

Further, if a difference between the analog input signal voltage and the comparative reference voltage is made narrower by the power voltage drop, then there is made longer a time period when the output voltage from the invertor remains at an intermediate voltage level between the power voltage level and the ground level. As a result, a time period flowing a punch through current through the invertor is made longer. When the operational point of the invertor remains at the intermediate voltage level, the invertor shows an amplification factor of about 10. If the difference between the analog input signal and the comparative reference voltage is small, then it is required to make a series connection of plural invertors in order to amplify the output voltage up to the logic level. This results in an increased power.

Under the above circumstances, it had been required to develop a novel chopper comparator showing high speed and low power operations fee of any malfunction under variation of logical threshold voltage of invertor in a sampling time period for sampling analog input signal voltage and comparative reference voltage and other time period.

SUMMARY OF THE INVENTION

Accordingly, it is an object of the present invention to provide a novel chopper comparator free from any problems and disadvantages as described above.

It is a further object of the present invention to provide a novel chopper comparator showing high speed and low power operations free of any malfunction under variation of logical threshold voltage of invertors in a sampling time period for sampling analog input signal voltage and comparative reference voltage and other time period.

The above and other objects, features and advantages of the present invention will be apparent from the following descriptions.

The present invention provides a voltage sampling circuitry provided in a chopper comparator for comparing an analog input signal voltage and a comparative reference voltage. The voltage sampling circuitry comprises the following elements. First and second input terminals are provided for receiving the analog input signal voltage and the comparative reference voltage respectively. A first capacitance is provided which has a first input side terminal being connected through a first switch to the first input terminal. A second capacitance is provided which has a second input side terminal being connected through a second switch to the second input terminal. A third switch is provided between the first and second input side terminals of the first and second capacitances, wherein after the first and second switches have turned OFF to discontinue applications of the analog input signal voltage and the comparative reference voltage to the first and second capacitances respectively, then the third switch turns ON to form a short circuit between the first and second input side terminals of the first and second capacitances.

The present invention also provides a chopper comparator for comparing an analog input signal voltage and a comparative reference voltage. The chopper comparator comprises the following elements. First and second input terminals are provided for receiving the analog input signal voltage and the comparative reference voltage respectively. A first capacitance is provided which has a first input side terminal being connected through a first switch to the first input terminal. A second capacitance is provided which has a second input side terminal being connected through a second switch to the second input terminal. A data latch circuit is provided which is connected to first and second output terminals of the first and second capacitances. A third switch is provided between the first and second input side terminals of the first and second capacitances, wherein after the first and second switches have turned OFF to discontinue applications of the analog input signal voltage and the comparative reference voltage to the first and second capacitances respectively, then the third switch turns ON to form a short circuit between the first and second input side terminals of the first and second capacitances.

BRIEF DESCRIPTION OF THE DRAWINGS

Preferred embodiments according to the present invention will be described in detail with reference to the accompanying drawings.

DISCLOSURE OF THE INVENTION

Figure 1:
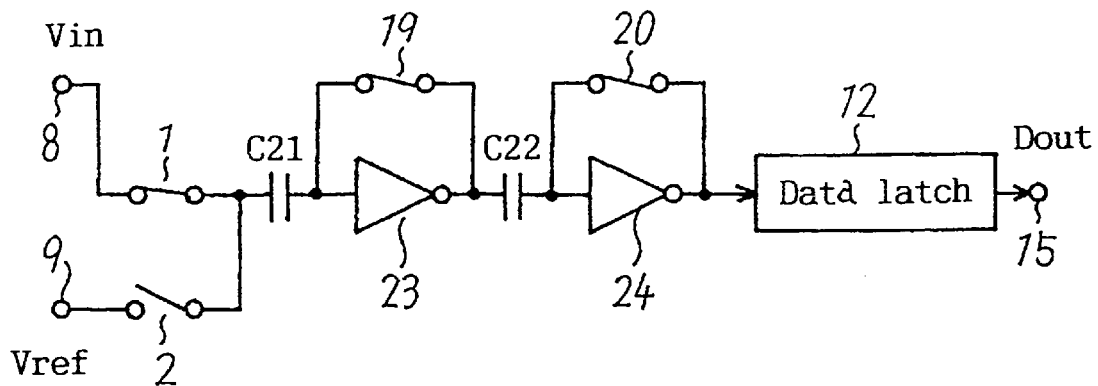
FIG. 1 is a circuit diagram illustrative of the conventional chopper comparator.
Figure 2:
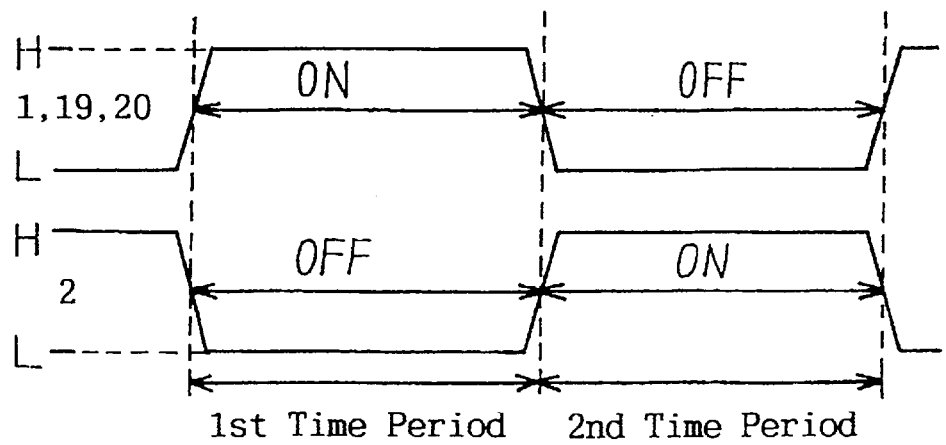
FIG. 2 is a timing chart illustrative of signal waveforms of the conventional chopper comparator.
Figure 3:
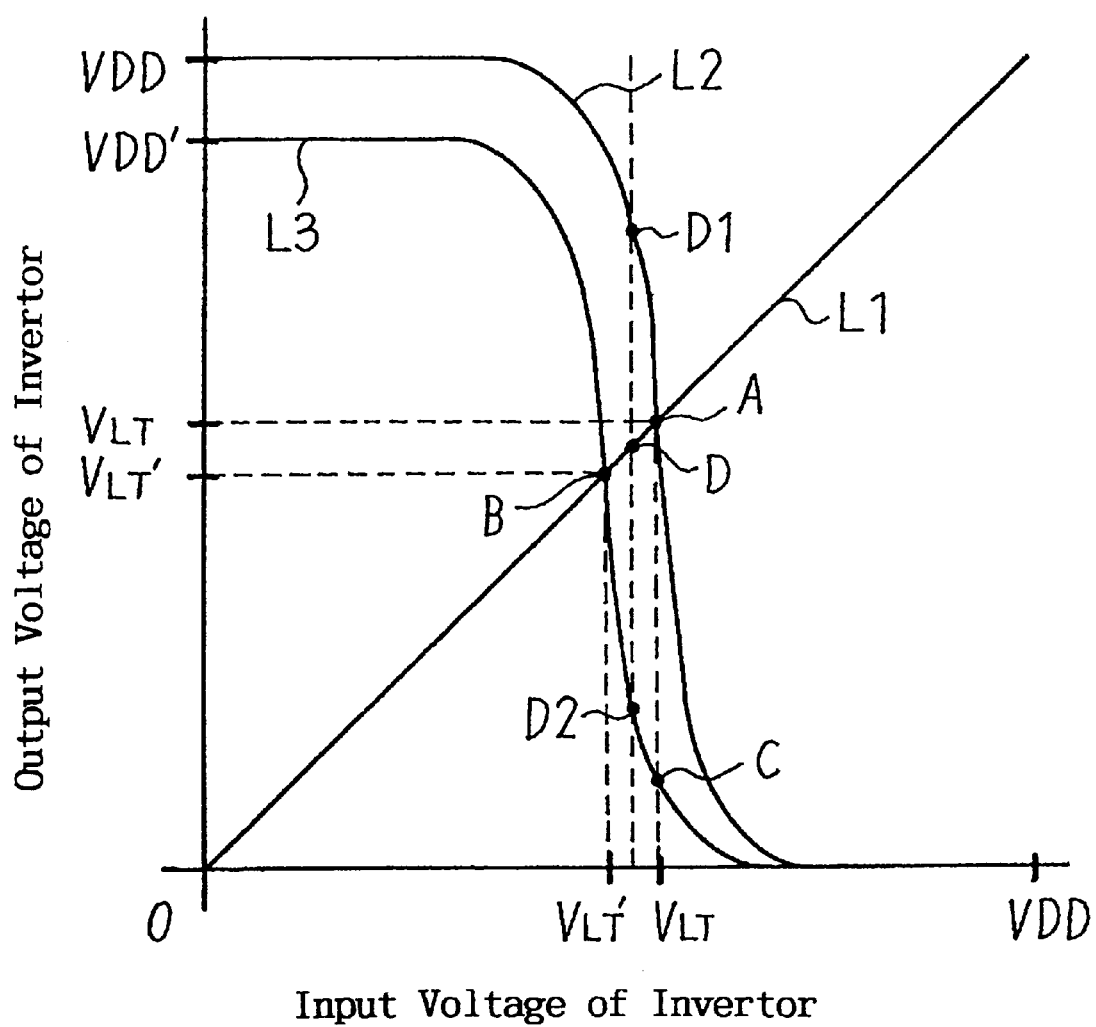
FIG. 3 is a diagram illustrative of input output charteristics L1 and output characteristics L2 and L3 of the invertor in the above conventional chopper comparator.

The present invention provides a voltage sampling circuitry provided in a chopper comparator for comparing an analog input signal voltage and a comparative reference voltage. The voltage sampling circuitry comprises the following elements. First and second input terminals are provided for receiving the analog input signal voltage and the comparative reference voltage respectively. A first capacitance is provided which has a first input side terminal being connected through a first switch to the first input terminal. A second capacitance is provided which has a second input side terminal being connected through a second switch to the second input terminal. A third switch is provided between the first and second input side terminals of the first and second capacitances, wherein after the first and second switches have turned OFF to discontinue applications of the analog input signal voltage and the comparative reference voltage to the first and second capacitances respectively, then the third switch turns ON to form a short circuit between the first and second input side terminals of the first and second capacitances.

It is preferable to further provide first and second voltage amplification circuits which are connected to first and second output side terminals of the first and second capacitances for amplifying voltages which appear on the first and second output side terminals of the first and second capacitances.

It is also preferable to further provide a positive feed-back circuit connected to first and second output side terminals of the first and second capacitances for positively feeding back variations in potential of the first and second output side terminals of the first and second capacitances having been caused by the short circuit formed between the first and second input side terminals of the first and second capacitances.

It is also preferable that the positive feed-back circuit comprises the following elements. A first invertor is provided which has an input terminal connected to the first output terminal of the first capacitance. A fourth switch is provided which is connected between the input terminal and an output terminal of the first invertor. A second invertor is provided which has an input terminal connected to the second output terminal of the second capacitance. A fifth switch is provided which is connected between the input terminal and an output terminal of the second invertor. A sixth switch is provided which is connected between the input terminal of the first invertor and the output terminal of the second invertor. A seventh switch is provided which is connected between the input terminal of the second invertor and the output terminal of the first invertor.

It is also preferable to further provide first and second voltage amplification circuits which are connected to first and second output side terminals of the first and second capacitances for amplifying voltages which appear on the first and second output side terminals, and further more provide a positive feed-back circuit connected to output side terminals of the first and second voltage amplification circuits for positively feeding back variations in potential of the output side terminal of the first and second voltage amplification circuits having been caused by the short circuit formed between the first and second input side terminals of the first and second capacitances.

It is also preferable that the positive feed-back circuit comprises the following elements. A first invertor is provided which has an input terminal connected to the output side terminal of the first voltage amplification circuit. A fourth switch is provided which is connected between the input terminal and an output terminal of the first invertor. A second invertor is provided which has an input terminal connected to the output side terminal of the second voltage amplification circuit. A fifth switch is provided which is connected between the input terminal and an output terminal of the second invertor. A sixth switch is provided which is connected between the input terminal of the fist invertor and the output terminal of the second invertor. A seventh switch is provided which is connected between the input terminal of the second invertor and the output terminal of the first invertor.

The present invention also provides a chopper comparator for comparing an analog input signal voltage and a comparative reference voltage. The chopper comparator comprises the following elements. First and second input terminals are provided for receiving the analog input signal voltage and the comparative reference voltage respectively. A first capacitance is provided which has a first input side terminal being connected through a first switch to the first input terminal. A second capacitance is provided which has a second input side terminal being connected through a second switch to the second input terminal. A data latch circuit is provided which is connected to first and second output terminals of the first and second capacitances. A third switch is provided between the fist and second input side terminals of the first and second capacitances, wherein after the first and second switches have turned OFF to discontinue applications of the analog input signal voltage and the comparative reference voltage to the first and second capacitances respectively, then the third switch turns ON to form a short circuit between the first and second input side terminals of the first and second capacitances.

It is preferable to further provide first and second voltage amplification circuits which are connected to first and second output side terminals of the first and second capacitances for amplifying voltages which appear on the first and second output side terminals, and the first and second voltage amplification circuits also being connected to an input side of the data latch circuit.

It is also preferable to further provide a positive feed-back circuit connected to first and second output side terminals of the first and second capacitances for positively feeding back variations in potential of the first and second output side terminals of the fist and second capacitances having been caused by the short circuit formed between the first and second input side terminals of the first and second capacitances, and the positive feed-back circuit also being connected to an input side of the data latch circuit.

It is also preferable that the positive feed-back circuit comprises the following elements. A first invertor is provided which has an input terminal connected to the first output terminal of the first capacitance. A fourth switch is provided which is connected between the input terminal and an output terminal of the first invertor. A second invertor is provided which has an input terminal connected to the second output terminal of the second capacitance. A fifth switch is provided which is connected between the input terminal and an output terminal of the second invertor. A sixth switch is provided which is connected between the input terminal of the first invertor and the output terminal of the second invertor. A seventh switch is provided which is connected between the input terminal of the second invertor and the output terminal of the first invertor.

It is also preferable to further provide first and second voltage amplification circuits which an connected to first and second output side terminals of the first and second capacitances for amplifying voltages which appear on the first and second output side terminals, and further more provide a positive feed-back circuit connected to output side terminals of the first and second voltage amplification circuits for positively feeding back variations in potential of the output side terminals of the first and second voltage amplification circuits having been caused by the short circuit formed between the first and second input side terminals of the first and second capacitances, and the positive feed-back circuit also being connected to an input side of the data latch circuit.

It is also preferable that the positive feed-back circuit comprises the following elements. A first invertor is provided which has an input terminal connected to the output side terminal of the first voltage amplification circuit. A fourth switch is provided which is connected between the input terminal and an output terminal of the first invertor. A second invertor is provided which has an input terminal connected to the output side terminal of the second voltage amplification circuit. A fifth switch is provided which is connected between the input terminal and an output terminal of the second invertor. A sixth switch is provided which is connected between the input terminal of the first invertor and the output terminal of the second invertor. A seventh switch is provided which is connected between the input terminal of the second invertor and the output terminal of the first invertor.

The present invention provides a chopper comparator for comparing an analog input signal voltage and a comparative reference voltage. The chopper comparator comprises the following elements. First and second input terminals are provided for receiving the analog input signal voltage and the comparative reference voltage respectively. A first capacitance is provided which has a first input side terminal connected through a first switch to the first input terminal. A second capacitance is provided which has a second input side terminal being connected through a second switch to the second input terminal. A positive feed-back circuit is provided which is connected to first and second output side terminals of the first and second capacitances. A data latch circuit is provided which is connected to the positive feed-back circuit. A third switch is provided between the first and second input side terminals of the first and second capacitances. After the first and second switches have turned OFF to discontinue applications of the analog input signal voltage and the comparative reference voltage to the first and second capacitances respectively, then the third switch turns ON to form a short circuit between the first and second input side terminals of the first and second capacitances, and further the positive feed-back circuit performs positively feeding back variations in potential of first and second output side terminals of the first and second capacitances having been caused by the short circuit formed between the first and second input side terminals of the first and second capacitances.

It is preferable to further provide first and second voltage amplification circuits which are connected to the first and second output side terminals of the first and second capacitances for amplifying voltages which appear on the first and second output side terminals, and the first and second voltage amplification circuits also being connected to an input side of the data latch circuit.

It is also preferable that the positive feed-back circuit comprises the following elements. A first invertor is provided which has an input terminal connected to the first output terminal of the first capacitance. A fourth switch is provided which is connected between the input terminal and an output terminal of the first invertor. A second invertor is provided which has an input terminal connected to the second output terminal of the second capacitance. A fifth switch is provided which is connected between the input terminal and an output terminal of the second invertor. A sixth switch is provided which is connected between the input terminal of the first invertor and the output terminal of the second invertor. A seventh switch is provided which is connected between the input terminal of the second invertor and the output terminal of the first invertor.

PREFERRED EMBODIMENTS

First Embodiment

Figure 4:
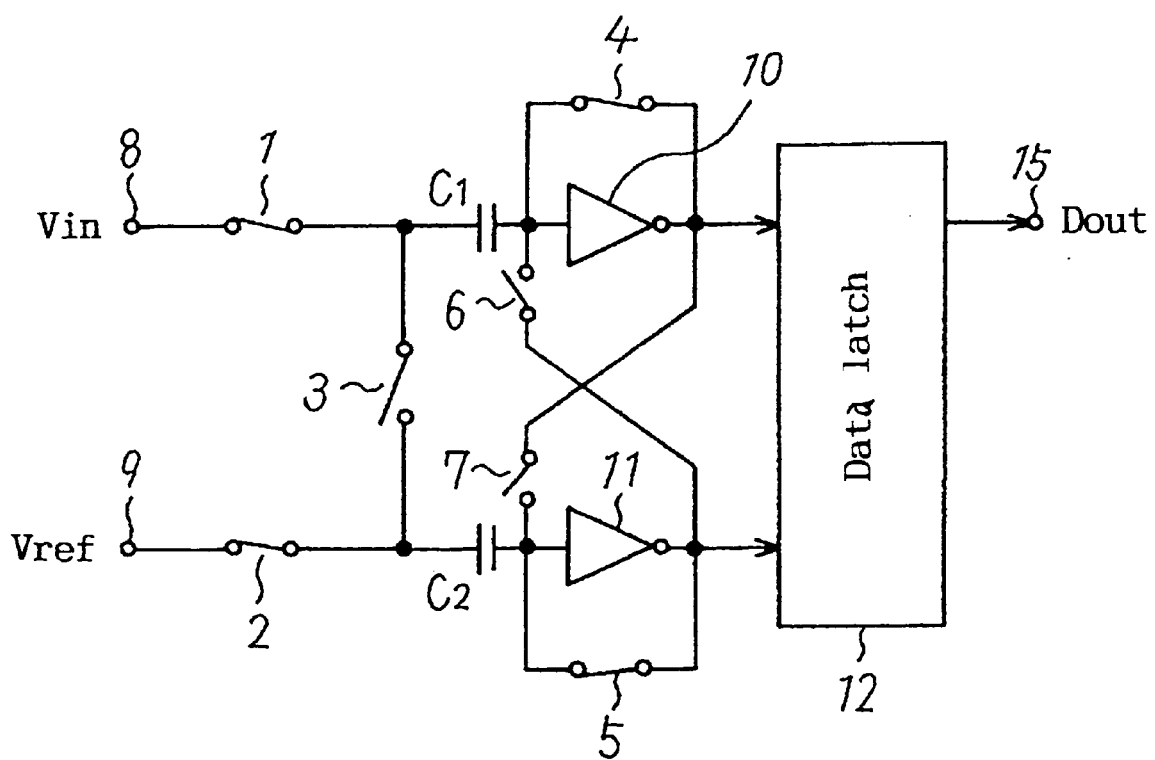
FIG. 4 is a circuit diagram illustrative of a novel chopper comparator in a first embodiment according to the present invention.
Figure 5:
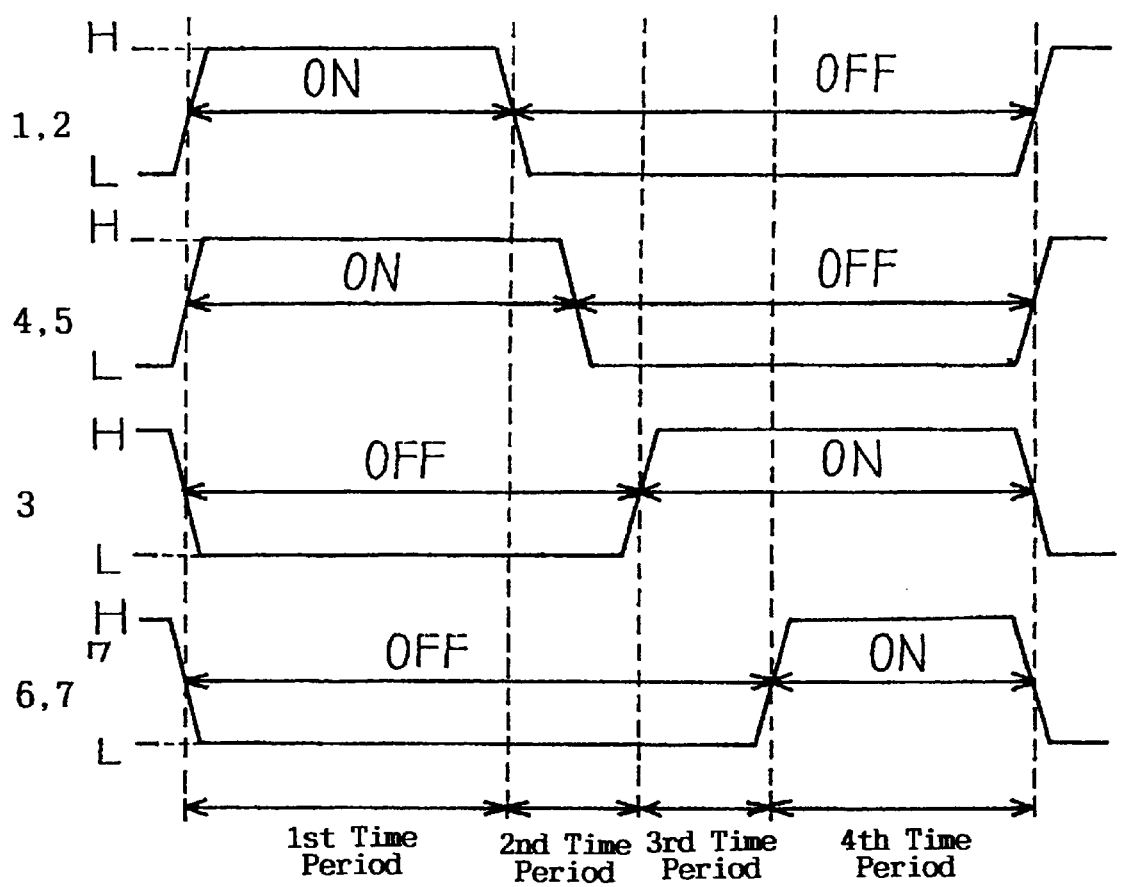
FIG. 5 is a timing chart illustrative of signal waveforms of a novel chopper comparator of FIG. 4.

A first embodiment according to the present invention will be described in detail with reference to FIGS. 4 and 5. FIG. 4 is a circuit diagram illusive of a novel chopper comparator in a first embodiment according to the present invention. FIG. 5 is a timing chart illustrative of signal waveforms of a novel chopper comparator of FIG. 4.

The novel chopper comparator has a voltage sampling circuit, a positive feed-back circuit connected to the voltage sampling circuit, and a data latch circuit connected to the positive feed-back circuit. The novel chopper comparator has first and second input terminals 8 and 9. The first input terminal is provided to receive an analog input signal voltage Vin whilst the second input terminal is provided to receive a comparative reference voltage Vref. The voltage sampling circuit has first and second capacitors C1 and C2. The first capacitor C1 has an input side terminal connected through a first switch 1 to the first input terminal Vin. The second capacitor C2 has an input side terminal connected through a second switch 2 to the second input terminal Vref. The input side terminals of the first and second capacitors C1 and C2 are connected through a third switch to each other. The positive feed-back circuit is connected to output side terminals of the first and second capacitors C1 and C2. The positive feedback circuit has first and second invertors 10 and 11 and fourth, fifth, sixth and seventh switches 4, 5, 6 and 7. The first invertor 10 has an input terminal connected to the output side terminal of the first capacitor C1. The second invertor 11 has an input terminal connected to the output side terminal of the second capacitor C2. The fourth switch 4 is connected between the input side terminal and the output side terminal of the first invertor 10 so that if the fourth switch 4 is in ON state, then a short circuit is formed between the input side terminal and the output side terminal of the first invertor 10. The fifth switch 5 is connected between the input side terminal and the output side terminal of the second invertor 11 so that if the fifth switch 5 is in ON state, then a short circuit is formed between the input side terminal and the output side terminal of the second invertor 11. The output side terminal of the first invertor 10 is connected through the seventh switch 7 to the input side terminal of the second invertor 11. The output side terminal of the second invertor 11 is connected through the sixth switch 6 to the input side terminal of the first invertor 12. The output side terminals of the first and second invertors 10 and 11 are connected to the data latch circuit 12. The data latch circuit 12 is connected to an output terminal 15 on which an output from the data latch circuit appears.

Operations of the above novel chopper comparator will be described in detail with reference to FIGS. 4 and 5. The operations of the above novel chopper comparator are divided into four time periods. In the first time period, the first, second, fourth and fifth switches 1, 2, 4 and 5 are in ON state, whilst the third, sixth and seventh switches 3, 6 and 7 are in OFF state. Since the fourth switch 4 is in ON state, then the short circuit is formed between the input side terminal and the output side terminal of the first invertor 10 whereby the first invertor 10 outputs a first logical threshold voltage VLT10. Since also the fifth switch 5 is in ON state, then the short circuit is formed between the input side terminal and the output side terminal of the second invertor 11 whereby the second invertor 11 outputs a second logical threshold voltage VLT11. Since the first switch 1 is in ON state, then the analog input signal voltage Vin is transmitted through the first switch 1 and applied to the input side terminal of the first capacitor C1. Since also the second switch 2 is in ON state, then the comparative reference voltage Vref is transmitted through the second switch 2 and applied to the input side terminal of the second capacitor C2. The input side terminal and the output side terminal of the first capacitor C1 are applied with the analog input signal voltage Vin and the first logical threshold voltage VLT10 respectively. Namely, the first capacitor C1 is biased by a voltage corresponding to a difference between the analog input signal voltage Vin and the first logical threshold voltage VLT10. This means that the first capacitor C1 performs a sampling of the difference between the analog input signal voltage Vin and the first logical threshold voltage VLT10. The input side terminal and the output side terminal of the second capacitor C2 are applied with the comparative reference voltage Vref and the second logical threshold voltage VLT11 respectively. Namely, the second capacitor C2 is biased by a voltage corresponding to a difference between the comparative reference voltage Vref and the second logical threshold voltage VLT11. This means that the second capacitor C2 performs a sampling of the difference between the comparative reference voltage Vref and the second logical threshold voltage VLT11.

In the second time period, the first and second switches 1 and 2 turn OFF to discontinue the applications of the analog input signal voltage Vin and the comparative reference voltage Vref to the first and second capacitors C1 and C2 respectively. Subsequently, the fourth and fifth switches 4 and 5 turn OFF to disconnect both the short circuits between the input side terminal and the output side terminal of the first and second invertors 10 and 11. During the second time period, the third, sixth and seventh switches 3, 6 and 7 remain OFF.

In the third time period, the third switch 3 turns ON to form a short circuit between the input side terminals of the first and second capacitors C1 and C2 so as to re-distribute the charges to the first and second capacitors C1 and C2. As described above, in the above first and second time periods, the input side terminals of the first and second capacitors C1 and C2 are applied with the analog input signal voltage Vin and the comparative reference voltage Vref. After the third switch 3 has turned ON to form the short circuit between the input side terminals of the first and second capacitors C1 and C2 in the third time period, the analog input signal voltage Vin of the input side terminal of the first capacitor C1 and the comparative reference voltage Vref of the output side terminal of the second capacitor C2 are varied to an intermediate voltage between the analog input signal voltage Vin and the comparative reference voltage Vref. Such potential variations having appeared on the input side terminals of the first and second capacitors C1 and C2 cause potential variations on the output side terminals of the first and second capacitors C1 and C2.

If, for example, the analog input signal voltage Vin was higher than the comparative reference voltage Vref, then the potential of the input side terminal of the first capacitor C1 is dropped to the intermediate potential from the analog input signal voltage Vin in turning the third switch 3 ON. This potential drop having appeared on the input side terminal of the first capacitor C1 causes a potential drop on the output side terminal of the first capacitor C1. This potential drop of the output side terminal of the, first capacitor C1 causes the same potential drop on the input terminal of the first invertor 10. This potential drop having appeared on the input terminal of the first invertor 10 causes a potential rise on the output terminal of the first invertor 10. On the other hand, the potential of the input side terminal of the second capacitor C2 is risen to the intermediate potential from the comparative reference voltage Vref in turning the third switch 3 ON. This potential rise having appeared on the input side terminal of the second capacitor C2 causes a potential rise on the output side terminal of the second capacitor C2. This potential rise of the output side terminal of the second capacitor C2 causes the same potential rise on the input terminal of the second invertor 11. This potential rise having appeared on the input terminal of the second invertor 11 causes a potential drop on the output terminal of the second invertor 11.

If, however, the analog input signal voltage Vin was lower than the comparative reference voltage Vref, then the potential of the input side terminal of the first capacitor C1 is risen to the intermediate potential from the analog input signal voltage Vin in turning the third switch 3 ON. This potential rise having appeared on the input side terminal of the first capacitor C1 causes a potential rise on the output side terminal of the first capacitor C1. This potential rise of the output side terminal of the first capacitor C1 causes the same potential rise on the input terminal of the first invertor 10. This potential rise having appeared on the input terminal of the first invertor 10 causes a potential drop on the output terminal of the first invertor 10. On the other hand, the potential of the input side terminal of the second capacitor C2 is dropped to the intermediate potential from the comparative reference voltage Vref in turning the third switch 3 ON. This potential drop having appeared on the input side terminal of the second capacitor C2 causes a potential drop on the output side terminal of the second capacitor C2. This potential drop of the output side terminal of the second capacitor C2 causes the same potential drop on the input terminal of the second invertor 11. This potential drop having appeared on the input terminal of the second invertor 11 causes a potential rise on the output terminal of the second invertor 11.

In the fourth time period, the sixth and seventh switches 6 and 7 turn ON to effect or form the positive-feedback circuit. The first, second, fourth and fifth switches 1, 2, 4 and 5 remain OFF whilst the third switch 3 remains ON. In the first to third time periods, the output terminal of the second invertor 11 is disconnected from the input terminal of the first invertor 10 and also the output terminal of the first invertor 10 is disconnected from the input terminal of the second invertor 11. In the fourth time period, however, the output terminal of the second invertor 11 is made connected to the input terminal of the first invertor 10 and also the output terminal of the first invertor 10 is made connected to the input terminal of the second invertor it. As a result, the output from the first invertor 10 is transmitted through the seventh switch 7 to the input terminal of the second invertor 11. The output from the second invertor 11 is transmitted through the six switch 6 to the input terminal of the first invertor 10. This positive feed-back circuit amplifies the outputs from the first and second invertors 10 and 11 and the amplified outputs are fetched by the data latch circuit 12.

If the analog input signal voltage Vin was lower than the comparative reference voltage Vref, then in the above third time period the potential rise appears on the input terminal of the first invertor 10 whilst the potential drop appears on the output terminal of the first invertor 10. On the other hand, the potential drop appears on the input terminal of the second invertor 11 whilst the potential rise appears on the output terminal of the second invertor 11. In the fourth time period, the sixth and seventh switches 6 and 7 turn ON to form the positive feed-back circuit. As a result, the potential drop having appeared on the output terminal of the first invertor 10 causes the potential drop of the input terminal of the second invertor 11. This potential drop on the input terminal of the second invertor 11 causes a potential rise on the output terminal of the second invertor 11. This potential rise having appeal on the output terminal of the second invertor 11 is superimposed on the potential rise caused by the potential rise of the output side terminal of the second invertor 11, thereby to amplify the potential rise on the output terminal of the second invertor 11. As a result, the amplified potential rise having appeared on the output terminal of the second invertor 11 is etched into the data latch circuit 12.

On the other hand, the potential rise appears on the input terminal of the first invertor 10 whilst the potential drop appears on the output terminal of the first invertor 10. In the fourth time period, the sixth and seventh switches 6 and 7 turn ON to form the positive feed-back circuit. As a result, the potential rise having appeared on the output terminal of the second invertor 11 causes the potential rise of the input terminal of the first invertor 10. This potential rise on the input terminal of the first invertor 10 cases a potential drop on the output terminal of the first invertor 10. This potential drop having appeared on the output terminal of the first invertor 10 is superimposed on the potential drop caused by the potential drop of the output side terminal of the first invertor 10, thereby to amplify the potential drop on the output terminal of the first invertor 10. As a result, the amplified potential drop having appeared on the output terminal of the first invertor 10 is fetched into the data latch circuit 12.

If, however, the analog input signal voltage Vin was higher than the comparative reference voltage Vref, then in the above third time period the potential drop appears on the input terminal of the first invertor 10 whilst the potential rise appears on the output terminal of the first invertor 10. On the other hand, the potential rise appears on the input terminal of the second invertor 11 whilst the potential drop appears on the output terminal of the second invertor 11. In the fourth time period, the sixth and seventh switches 6 and 7 turn ON to form the positive feed-back circuit. As a result, the potential rise having appeared on the output terminal of the first invertor 10 causes the potential rise of the input terminal of the second invertor 11. This potential rise on the input terminal of the second invertor 11 causes a potential drop on the output terminal of the second invertor 11. This potential drop having appeared on the output terminal of the second invertor 11 is superimposed on the potential drop caused by the potential drop of the output side terminal of the second invertor 11, thereby to amplify the potential drop on the output terminal of the second invertor 11. As a result, the amplified potential drop having appeared on the output terminal of the second invertor 11 is fetched into the data latch circuit 12.

On the other hand, the potential drop appears on the input terminal of the first invertor 10 whilst the potential rise appears on the output terminal of the first invertor 10. In the fourth time period, the sixth and seventh switches 6 and 7 turn ON to form the positive feed-back circuit. As a result, the potential drop having appeared on the output terminal of the second invertor 11 causes the potential drop of the input terminal of the first invertor 10. This potential drop on the input terminal of the first invertor 10 cases a potential rise on the output terminal of the first invertor 10. This potential rise having appeared on the output terminal of the first invertor 10 is superimposed on the potential rise caused by the potential rise of the output side terminal of the first invertor 10, thereby to amplify the potential rise on the output terminal of the first invertor 10. As a result, the amplified potential rise having appeared on the output terminal of the first invertor 10 is fetched into the data latch circuit 12.

Consequently, the above positive feed-back circuit amplifies the output voltages from the first and second invertors 10 and 11. In the fourth time period, the data latch circuit 12 fetches the amplified output voltages from the first and second invertors 10 and 11 for translations into the logic levels and subsequent comparisons thereof. The result of the comparison will appear on the output terminal 15 of the chopper comparator.

The following descriptions will focus on the operations of the above chopper comparator when a power voltage is varied by superimposing noises onto a power source. The variation of the power voltage causes variations in the first and second logical threshold voltages of the first and second invertors 10 and 11. The first and second logical threshold voltages VLT10 and VLT11 of the first and second invertors 10 and 11 are varied in the same phase into third and fourth logical threshold voltages VLT10' and VLT11'. A difference between the third logical threshold voltage VLT10' from the first logical threshold voltage VLT10 has the same polarity as a difference between the fourth logical threshold voltage VLT11' from the second logical threshold voltage VLT11. Namely, the first and second logical threshold voltages VLT10 and VLT11 of the first and second invertors 10 and 11 are varied in the same phase and in the same polarity into the third and fourth logical threshold voltages VLT10' and VLT11'. Whereas the first and second invertors 10 and 11 were designed to be identical with each other, the first and second logical threshold voltages VLT10 and VLT11 of the first and second invertors 10 and 11 are somewhat different from each other by variations thereof in manufacturing processes, for which reason the third and fourth logical threshold voltages VLT10' and VLT11' of the first and second invertors 10 and 11 are also somewhat different from each other. In the third time period, however, the third switch turns ON to form a short circuit between the input side terminals of the first and second invertors 10 and 11 whereby the output side terminals of the first and second capacitors C1 and C2 or the input terminals of the first and second invertors 10 and 11 show potential variations in response to the potential variations having appeared on the input side terminals of the first and second capacitors C1 and C2 in accordance with the difference between the analog input signal voltage Vin and the comparative reference voltage Vref in forming the short circuit through the third switch 3. Accordingly, even if the variations in the logical threshold voltages of the first and second invertors 10 and 11 caused by the variation in power voltage of the power source would be higher than a difference between the analog input signal voltage Vin and the comparative reference voltage Vref then a relationship of whether the output from the first invertor 10 is higher or lower than the output from the second invertor 11 would be the same as when no voltage variation appears on the first and second logical threshold voltages VLT10 and VLT11. In the fourth time period, the sixth and seventh switches 6 and 7 turn ON to form the positive feed-back circuit. A relationship of whether the output from the first invertor 10 is higher or lower than the output from the second invertor 11 would then be the same as when no voltage variation appears on the first and second logical threshold voltages VLT10 and VLT11. The above novel chopper comparator shows no malfunctions in operations even if the first and second logical threshold voltages VLT10 and VLT11 are varied by the variation in voltage of the power source. Further, the positive feed-back circuit shortens the time period when outputs from the invertors are in the intermediate voltage levels even if the difference between the analog input signal voltage Vin and the comparative reference voltage Vref is small. The shortening the time period when outputs from the invertors are in the intermediate voltage levels causes reduction in punch through current of the first and second invertors 10 ands 11. This enables the chopper comparator to perform, at a relatively small current consumption and a relatively high speed, a comparison operation between the analog input signal voltage Vin and the comparative reference voltage Vref even if the difference between the analog input signal voltage Vin and the comparative reference voltage Vref is small.

Second Embodiment

A second embodiment according to the present invention will be described in detail with reference to FIGS. 6 and 7.

Figure 6:
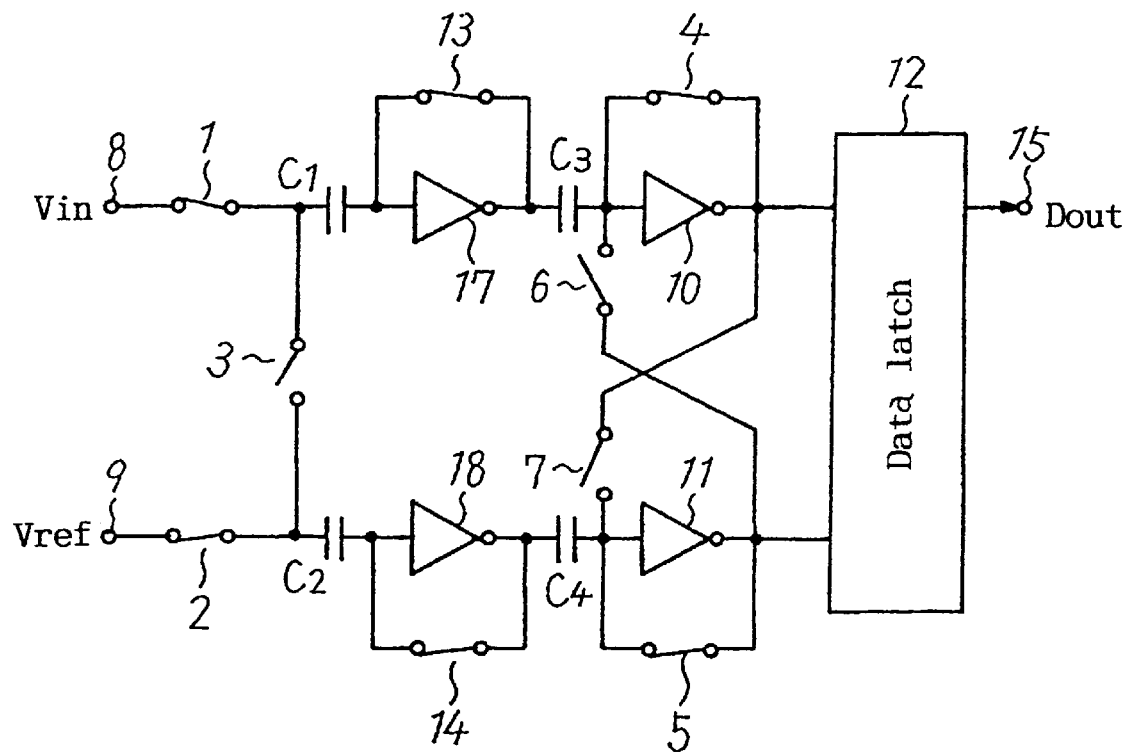
FIG. 6 is a circuit diagram illustrative of a novel chopper comparator in a second embodiment according to the present invention.
Figure 7:
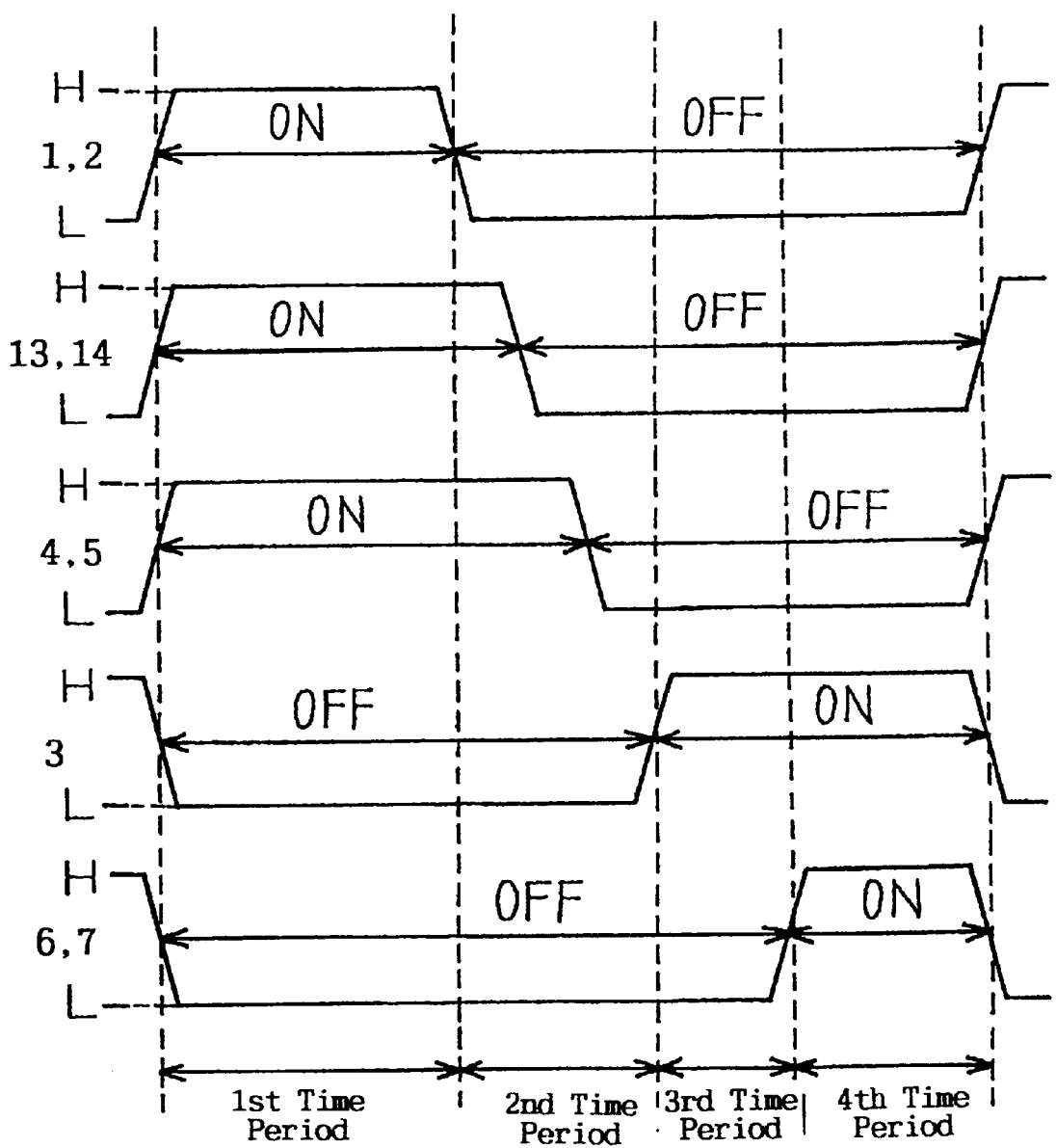
FIG. 7 is a timing chart illustrative of signal waveforms of a novel chopper comparator of FIG. 6.

FIG. 6 is a circuit diagram illustrative of a novel chopper comparator in a second embodiment according to the present invention. FIG. 7 is a timing chart illustrative of signal waveforms of a novel chopper comparator of FIG. 6.

The novel chopper comparator has a voltage sampling circuit, a positive feed-back circuit connected to the voltage sampling circuit, and a data latch circuit connected to the positive feed-back circuit. The novel chopper comparator has first and second input terminals 8 and 9. The first input terminal 8 is provided to receive an analog input signal voltage Vin whilst the second input terminal 9 is provided to receive a comparative reference voltage Vref. The voltage sampling circuit has first, second third and fourth capacitors C1, C2, C3 and C4 and further third and fourth invertors 17 and 18 as well as eighth and ninth switches 13 and 14. The first capacitor C1 has an input side terminal connected through a first switch 1 to the first input terminal Vin. The second capacitor C2 has an input side terminal connected through a second switch 2 to the second input terminal Vref. The input side terminals of the first and second capacitors C1 and C2 are connected through a third switch to each other. The third invertor 17 has an input terminal connected to the output side terminal of the first capacitor C1. The fourth invertor 18 has an input terminal connected to the output side terminal of the second capacitor C2. The eighth switch 13 is connected between the input side terminal and the output side terminal of the third invertor 17 so that if the eighth switch 13 is in ON state, then a short circuit is formed between the input side terminal and the output side terminal of the third invertor 17. The ninth switch 14 is connected between the input side terminal and the output side terminal of the fourth invertor 18 so the if the ninth switch 14 is in ON state, then a short circuit is formed between the input side terminal and the output side terminal of the fourth invertor 18. The output side terminal of the third invertor 17 is connected to an input side terminal of the third capacitor C3. The output side terminal of the fourth invertor 18 is connected to an input side terminal of the fourth capacitor C4.

The positive feed-back circuit is connected to output side terminals of the third and fourth capacitors C3 and C4. The positive feedback circuit has first and second invertors 10 and 11 and fourth, fifth, sixth and seventh switches 4, 5, 6 and 7. The first invertor 10 has an input terminal connected to the output side terminal of the third capacitor C3. The second invertor 11 has an input terminal connected to the output side terminal of the fourth capacitor C4. The fours switch 4 is connected between the input side terminal and the output side terminal of the first invertor 10 so that if the fourth switch 4 is in ON state, then a short circuit is formed between the input side terminal and the output side terminal of the first invertor 10. The fifth switch 5 is connected between the input side terminal and the output side terminal of the second invertor 11 so that if the fifth switch 5 is in ON state, then a short circuit is formed between the input side terminal and the output side terminal of the second invertor 11. The output side terminal of the first invertor 10 is connected through the seventh switch 7 to the input side terminal of the second invertor 11. The output side terminal of the second invertor 11 is connected through the sixth switch 6 to the input side terminal of the first invertor 10. The output side terminals of the first and second invertors 10 and 11 are connected to the data latch circuit 12. The data latch circuit 12 is connected to an output terminal 15 on which an output from the data latch circuit appears.

Operations of the above novel chopper comparator will be described in detail with reference to FIGS. 6 and 7. The operations of the above novel chopper comparator are divided into four time periods. In the first time period, the first, second, fourth, fifth, eighth and ninth switches 1, 2, 4, 5 13 and 18 are in ON state, whilst the third, sixth and seventh switches 3, 6 and 7 are in OFF state. Since the eighth switch 13 is in ON state, then the short circuit is formed between the input side terminal and the output side terminal of the third invertor 17 whereby the third invertor 17 outputs a third logical threshold voltage VLT17. Since also the ninth switch 14 is in ON state, then the short circuit is formed between the input side terminal and the output side terminal of the fourth invertor 18 whereby the fourth invertor 18 outputs a fourth logical threshold voltage VLT18. Since the fourth switch 4 is in ON state, then the short circuit is formed between the input side terminal and the output side terminal of the first invertor 10 whereby the first invertor 10 outputs a first logical threshold voltage VLT10. Since also the fifth switch 5 is in ON state, then the short circuit is formed between the input side terminal and the output side terminal of the second invertor 11 whereby the second invertor 11 outputs a second logical threshold voltage VLT11. Since the first switch 1 is in ON state, then the analog input signal voltage Vin is transmitted through the first switch 1 and applied to the input side terminal of the first capacitor C1. Since also the second switch 2 is in ON state, then the comparative reference voltage Vref is transmitted through the second switch 2 and applied to the input side terminal of the second capacitor C2. The input side terminal and the output side terminal of the first capacitor C1 are applied with the analog input signal voltage Vin and the third logical threshold voltage VLT17 respectively. Namely, the first capacitor C1 is biased by a voltage corresponding to a difference between the analog input signal voltage Vin and the third logical threshold voltage VLT17. This means that the first capacitor C1 performs a sampling of the difference between the analog input signal voltage Vin and the third logical threshold voltage VLT17. The input side terminal and the output side terminal of the second capacitor C2 are applied with the comparative reference voltage Vref and the fourth logical threshold voltage VLT18 respectively. Namely, the second capacitor C2 is biased by a voltage corresponding to a difference between the comparative reference voltage Vref and the fourth logical threshold voltage VLT18. This means that the second capacitor C2 performs a sampling of the difference between the comparative reference voltage Vref and the fourth logical threshold voltage VLT18. The input side terminal and the output side terminal of the third capacitor C3 are applied with the third and first logical threshold voltages VLT17 and VLT10 respectively. Namely, the third capacitor C3 is biased by a voltage corresponding to a difference between the third and first logical threshold voltages VLT17 and VLT10. This means that the third capacitor C3 performs a sampling of the difference between the third and first logical threshold voltages VLT17 and VLT10. The input side terminal and the output side terminal of the fourth capacitor C4 are applied with the fourth and second logical threshold voltages VLT18 and VLT11 respectively. Namely, the fourth capacitor C4 is biased by a voltage corresponding to a difference between the fourth and second logical threshold voltages VLT18 and VLT11. This means that the fourth capacitor C4 performs a sampling of the difference between the fourth and second logical threshold voltages VLT18 and VLT11.

In the second time period, the first and second switches 1 and 2 turn OFF to discontinue the applications of the analog input signal voltage Vin and the comparative reference voltage Vref to the first and second capacitors C1 and C2 respectively. Subsequently, the eighth and ninth switches 13 and 14 turn OFF to disconnect both the short circuits between the input side terminal and the output side terminal of the third and fourth invertors 17 and 18. Further, subsequently, the fourth and fifth switches 4 and 5 turn OFF to disconnect both the short circuits between the input side terminal and the output side terminal of the first and second invertors 10 and 11. During the second time period, the third, sixth and seventh switches 3, 6 and 7 remain OFF.

In the third time period, the third switch 3 turns ON to form a short circuit between the input side terminals of the first and second capacitors C1 and C2 so as to redistribute the charges to the first and second capacitors C1 and C2. As described above, in the above first and second time periods, the input side terminals of the first and second capacitors C1 and C2 are applied with the analog input signal voltage Vin and the comparative reference voltage Vref. After the third switch 3 has turned ON to form the short circuit between the input side terminals of the first and second capacitors C1 and C2 in the third time period, the analog input signal voltage Vin of the input side terminal of the first capacitor C1 and the comparative reference voltage Vref of the output side terminal of the second capacitor C2 are varied to an intermediate voltage between the analog input signal voltage Vin and the comparative reference voltage Vref. Such potential variations having appeared on the input side terminals of the first and second capacitors C1 and C2 cause potential variations on the output side terminals of the first and second capacitors C1 and C2. Such the potential variations having appeared on the output side terminals of the first and second capacitors C1 and C2 cause potential variations on the input terminals of the third and fourth investors 17 and 18. Such the potential variations having appeared on the input terminals of the third and fourth invertors 17 and 18 cause potential variations on the output terminals of the third and fourth invertors 17 and 18. Such the potential variations having appeared on the potential variations on the output terminals of the third and fourth invertors 17 and 18 cause potential variations on the input terminals of the third and fourth capacitors C3 and C4. Such the potential variations having appeared on the input side terminals of the third and fourth capacitors C3 and C4 cause potential variations on the output side terminals of the third and fourth capacitors C3 and C4. Such the potential variations having appeared on the output side terminals of the third and fourth capacitors C3 and C4 cause potential variations on the input terminals of the first and second invertors 10 and 11. Such the potential variations having appeared on the input terminals of the first and second invertors 10 and 11 cause potential variations on the output terminals of the first and second invertors 10 and 11.

If, for example, the analog input signal voltage Vin was higher than the comparative reference voltage Vref, then the potential of the input side terminal of the first capacitor C1 is dropped to the intermediate potential from the analog input signal voltage Vin in turning the third switch 3 ON. This potential drop having appeared on the input side terminal of the first capacitor C1 causes a potential drop on the output side terminal of the first capacitor C1. This potential drop of the output side terminal of the first capacitor C1 causes the same potential drop on the input terminal of the third invertor 17. This potential drop having appeared on the input terminal of the third invertor 17 causes a potential rise on the output terminal of the third invertor 17. This potential rise having appeared on the output terminal of the third invertor 17 causes the same potential rise on the input side terminal of the third capacitor C3. This potential rise having appeared on the input side terminal of the third capacitor C3 causes a potential rise on the output side terminal of the third capacitor C3. This potential rise having appeared on the output side terminal of the third capacitor C3 causes the same potential rise on the input terminal of the first invertor 10. This potential rise having appeared on the input terminal of the first invertor 10 causes a potential drop on the output terminal of the first invertor 10.

On the other hand, the potential of the input side terminal of the second capacitor C2 is risen to the intermediate potential from the comparative reference voltage Vref in turning the third switch 3 ON. This potential rise having appeared on the input side terminal of the second capacitor C2 causes a potential rise on the output side terminal of the second capacitor C2. This potential rise of the output side terminal of the second capacitor C2 causes the same potential rise on the input terminal of the fourth invertor 18. This potential rise having appeared on the input terminal of the fourth invertor 18 causes a potential drop on the output terminal of the fourth invertor 18. This potential drop having appeared on the output terminal of the fourth invertor 18 causes the same potential drop on the input side terminal of the fourth capacitor C4. This potential drop having appeared on the input side terminal of the fourth capacitor C4 causes a potential drop on the output side terminal of the fourth capacitor C4. This potential drop having appeared on the output side terminal of the capacitor C4 causes the same potential drop on the input terminal of the second invertor 11. This potential drop having appeared on the input terminal of the second invertor 11 causes a potential rise on the output terminal of the second invertor 11.

If, however, the analog input signal voltage Vin was lower than the comparative reference voltage Vref, then the potential of the input side terminal of the first capacitor C1 is risen to the intermediate potential from the analog input signal voltage Vin in turning the third switch 3 ON. This potential rise having appeared on the input side terminal of the first capacitor C1 causes a potential rise on the output side terminal of the first capacitor C1. This potential rise of the output side terminal of the first capacitor C1 causes the same potential rise on the input terminal of the third invertor 17. This potential rise having appeared on the input terminal of the third invertor 17 causes a potential drop on the output terminal of the third invertor 17. This potential drop having appeared on the output terminal of the third invertor 17 causes the same potential drop on the input side terminal of the third capacitor C3. This potential drop having appeared on the input side terminal of the third capacitor C3 causes a potential drop on the output side terminal of the third capacitor C3. This potential drop having appeared on the output side terminal of the third capacitor C3 causes the same potential drop on the input terminal of the first invertor 10. This potential drop having appeared on the input terminal of the first invertor 10 causes a potential rise on the output terminal of the first invertor 10.

On the other hand, the potential of the input side terminal of the second capacitor C2 is dropped to the intermediate potential from the comparative reference voltage Vref in tuning the third switch 3 ON. This potential drop having appeared on the input side terminal of the second capacitor C2 causes a potential drop on the output side terminal of the second capacitor C2. This potential drop of the output side terminal of the second capacitor C2 causes the same potential drop on the input terminal of the fourth invertor 18. This potential drop having appeared on the input terminal of the fourth invertor 18 causes a potential rise on the output terminal of the fourth invertor 18. This potential rise having appeared on the output terminal of the fourth invertor 18 causes the same potential rise on the input side terminal of the fourth capacitor C4. This potential rise having appeared on the input side terminal of the fourth capacitor C4 causes a potential rise on the output side terminal of the fourth capacitor C4. This potential rise having appeared on the output side terminal of the fourth capacitor C4 causes the same potential rise on the input terminal of the second invertor 11. This potential rise having appeared on the input terminal of the second invertor 11 causes a potential drop on the output terminal of the second invertor 11.

In the fourth time period, the sixth and seventh switches 6 and 7 turn ON to effect or form the positive feedback circuit. The first, second, fourth, fifth eighth and ninth switches 1, 2, 4, 5, 13 and 14 remain OFF whilst the third switch 3 remains ON. In the above first to third time periods, the output terminal of the second invertor 11 is disconnected from the input terminal of the first invertor 10 and also the output terminal of the first invertor 10 is disconnected from the input terminal of the second invertor 11. In the fourth time period, however, the output terminal of the second invertor 11 is made connected to the input terminal of the first invertor 10 and also the output terminal of the first invertor 10 is made connected to the input terminal of the second invertor 11. As a result the output from the first invertor 10 is transmitted through the seventh switch 7 to the input terminal of the second invertor 11. The output from the second invertor 11 is transmitted through the sixth switch 6 to the input terminal of the first invertor 10. This positive feed-back circuit amplifies the outputs from the first and second invertors 10 and 11 and the amplified outputs are fetched by the data latch circuit 12.

If the analog input signal voltage Vin was higher than the comparative reference voltage Vref, then in the above third time period the potential rise appears on the input terminal of the first invertor 10 whilst the potential drop appears on the output terminal of the first invertor 10. On the other hand, the potential drop appears on the input terminal of the second invertor 11 whilst the potential rise appears on the output terminal of the second invertor 11. In the fourth time period, the sixth and seventh switches 6 and 7 turn ON to form the positive feed-back circuit. As a result, the potential drop having appeared on the output terminal of the first invertor 10 causes the potential drop of the input terminal of the second invertor 11. This potential drop on the input terminal of the second invertor 11 cases a potential rise on the output terminal of the second invertor 11. This potential rise having appeared on the output terminal of the second invertor 11 is superimposed on the potential rise caused by the potential rise of the output side terminal of the second invertor 11, thereby to amplify the potential rise on the output terminal of the second invertor 11. As a result, the amplified potential rise having appeared on the output terminal of the second invertor 11 is fetched into the data latch circuit 12.

On the other hand, the potential rise appears on the input terminal of the first invertor 10 whilst the potential drop appears on the output terminal of the first invertor 10. In the fourth time period, the sixth and seventh switches 6 and 7 turn ON to form the positive feed-back circuit. As a result, the potential rise having appeared on the output terminal of the second invertor 11 causes the potential rise of the input terminal of the first invertor 10. This potential rise on the input terminal of the first invertor 10 cases a potential drop on the output terminal of the first invertor 10. This potential drop having appeared on the output terminal of the first invertor 10 is superimposed on the potential drop caused by the potential drop of the output side terminal of the first invertor 10, thereby to amplify the potential drop on the output terminal of the first invertor 10. As a result, the amplified potential drop having appeared on the output terminal of the first invertor 10 is fetched into the data latch circuit 12.

If, however, the analog input signal voltage Vin was lower than the comparative reference voltage Vref, then in the above third time period the potential drop appears on the input terminal of the first invertor 10 whilst the potential rise appears on the output terminal of the first invertor 10. On the other hand, the potential rise appears on the input terminal of the second invertor 11 whilst the potential drop appears on the output terminal of the second invertor 11. In the fourth time period, the sixth and seventh switches 6 and 7 turn ON to form the positive feed-back circuit. As a result, the potential rise having appeared on the output terminal of the first invertor 10 causes the potential rise of the input terminal of the second invertor 11. This potential rise on the input terminal of the second invertor 11 cases a potential drop on the output terminal of the second invertor 11. This potential drop having appeared on the output terminal of the second invertor 11 is superimposed on the potential drop caused by the potential drop of the output side terminal of the second invertor 11, thereby to amplify the potential drop on the output terminal of the second invertor 11. As a result, the amplified potential drop having appeared on the output terminal of the second invertor 11 is fetched into the data latch circuit 12.

On the other hand, the potential drop appears on the input terminal of the first invertor 10 whilst the potential rise appears on the output terminal of the first invertor 10. In the fourth time period, the sixth and seventh switches 6 and 7 turn ON to form the positive feed-back circuit. As a result, the potential drop having appeared on the output terminal of the second invertor 11 causes the potential drop of the input terminal of the first invertor 10. This potential drop on the input terminal of the first invertor 10 cases a potential rise on the output terminal of the first invertor 10. This potential rise having appeared on the output terminal of the first invertor 10 is superimposed on the potential rise caused by the potential rise of the output side terminal of the first invertor 10, thereby to amplify the potential rise on the output terminal of the first invertor 10. As a result, the amplified potential rise having appeared on the output terminal of the first invertor 10 is fetched into the data latch circuit 12.

Consequently, the above positive feed-back circuit amplifies the output voltages from the first and second invertors 10 and 11. In the fourth time period, the data latch circuit 12 fetches the amplified output voltages from the first and second invertors 10 and 11 for translations into the logic levels and subsequent comparisons thereof. The result of the comparison will appear on the output terminal 15 of the chopper comparator.

The following descriptions will focus on the operations of the above chopper comparator when a power voltage is varied by superimposing noises onto a power source. The variation of the power voltage causes variations in the first, second, third and fourth logical threshold voltages VLT10, VLT11, VLT17 and VLT18 of the first, second, third and fourth invertors 10, 11 17 and 18. The first, second, third and fourth logical threshold voltages VLT10, VLT11, VLT17 and VLT18 of the first, second, third and fourth invertors 10, 11 17 and 18 are varied in the same phase into fifth, sixth, seventh and eighth logical threshold voltages VLT10', VLT11', VLT17' and VLT18'. A difference between the fifth logical threshold voltage VLT10' from the first logical threshold voltage VLT10 has the same polarity as a difference between the sixth logical threshold voltage VLT11' from the second logical threshold voltage VLT11. Namely, the first and second logical threshold voltages VLT10 and VLT11 of the first and second invertors 10 and 11 are varied in the same phase and in the same polarity into the fifth and sixth logical threshold voltages VLT10' and VLT11'. Whereas the first and second invertors 10 and 11 were designed to be identical with each other, the first and second logical threshold voltages VLT10 and VLT11 of the first and second invertors 10 and 11 are somewhat different from each other by variations thereof in manufacturing processes, for which reason the fifth and sixth logical threshold voltages VLT10' and VLT11' of the first and second invertors 10 and 11 are also somewhat different from each other. The third invertor 17, the eighth switch 13 and the first capacitor C1 are in the form of a voltage amplification circuit. The fourth invertor 18, the ninth switch 14 and the second capacitor C2 are in the form of a voltage amplification circuit. Those voltage amplification circuits perform to amplify the difference between the analog input signal voltage Vin and the comparative reference voltage Vref. In the third time period, however, the third switch turns ON to form a short circuit between the input side terminals of the first and second invertors 10 and 11 whereby the output side terminals of the first and second capacitors C1 and C2 show potential variations in response to the potential variations having appeared on the input side terminals of the first and second capacitors C1 and C2 in accordance with the difference between the amplified analog input signal voltage Vin and the amplified comparative reference voltage Vref. Accordingly, even if the variations in the logical threshold voltages of the first and second invertors 10 and 11 caused by the variation in power voltage of the power source would be higher than a difference between the analog input signal voltage Vin and the comparative reference voltage Vref, then a relationship of whether the output from the first invertor 10 is higher or lower than the output from the second invertor 11 would be the same as when no voltage variation appears on the first and second logical threshold voltages VLT10 and VLT11. In the fourth time period, the sixth and seventh switches 6 and 7 turn ON to form the positive feed-back circuit. A relationship of whether the output from the first invertor 10 is higher or lower than the output from the second invertor 11 would then be the same as when no voltage variation appears on the first and second logical threshold voltages VLT10 and VLT11. Further, the above voltage amplifying circuits reduces a critical voltage difference between the analog input signal voltage Vin and the comparative reference voltage Vref wherein the chopper comparator enables the intended comparative operation when the difference between the analog input signal voltage Vin and the comparative reference voltage Vref is not less than the critical voltage difference. The above voltage amplification circuits are capable of reducing the influence of the variations of the logical threshold voltages of the invertors by a reciprocal number of a gain value of the voltage amplification circuits. The above novel chopper comparator shows no malfunctions in operations even if the first and second logical threshold voltages VLT10 and VLT11 are largely varied by the variation in voltage of the power source. Further more, the positive feed-back circuit shortens the time period when outputs from the invertors are in the intermediate voltage levels even if the difference between the analog input signal voltage Vin and the comparative reference voltage Vref is small. The shortening the time period when outputs from the invertors are in the intermediate voltage levels causes reduction in punch through current of the first and second invertors 10 ands 11. This enables the chopper comparator to perform, at a relatively small current consumption and a relatively high speed, a comparison operation between the analog input signal voltage Vin and the comparative reference voltage Vref even if the difference between the analog input signal voltage Vin and the comparative reference voltage Vref is small.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A voltage sampling circuitry provided in a chopper comparator for comparing an analog input signal voltage and a comparative reference voltage, said voltage sampling circuitry comprising:

first and second input terminals being provided for receiving said analog input signal voltage and said comparative reference voltage respectively;

a first capacitor having a first input side terminal being connected through a first switch to said first input terminal;

a second capacitor having a second input side terminal being connected through a second switch to said second input terminal;

a third switch being provided between said first and second input side terminals of said first and second capacitors;

a first invertor having an input terminal connected to a first output terminal of said first capacitor and an output terminal connected to said input terminal of the first invertor through a fourth switch;

a second invertor having an input terminal connected to a second output terminal of said second capacitor and an output terminal connected to said input terminal of the second invertor through a fifth switch;

a sixth switch being connected between said input terminal of said first invertor and said output terminal of said second invertor; and a seventh switch being connected between said input terminal of said second invertor and said output terminal of said first invertor, wherein after said first and second switches have turned OFF to discontinue applications of said analog input signal voltage and said comparative reference voltage to said first and second capacitors respectively, said third switch turns ON to form a short circuit between said first and second input side terminals of said first and second capacitors.

2. A chopper comparator for comparing an analog input signal voltage and a comparative reference voltage, said chopper comparator comprising:

first and second input terminals being provided for receiving said analog input signal voltage and said comparative reference voltage respectively;

a first capacitor having a first input side terminal being connected through a first switch to said first input terminal;

a second capacitor having a second input side terminal being connected through a second switch to said second input terminal;

first and second voltage amplification circuits being connected to first and second output side terminals of said first and second capacitors, respectively, for amplifying voltages which appear on said first and second output side terminals;

a data latch circuit being connected to first and second output terminals of said first and second voltage amplification circuits, respectively; and a third switch being provided between said first and second input side terminals of said first and second capacitors, wherein after said first and second switches have turned OFF to discontinue applications of said analog input signal voltage and said comparative reference voltage to said first and second capacitors respectively, said third switch turns ON to form a short circuit between said first and second input side terminals of said first and second capacitors.

3. A chopper comparator for comparing an analog input signal voltage and a comparative reference voltage, said chopper comparator comprising:

first and second input terminals being provided for receiving said analog input signal voltage and said comparative reference voltage respectively;

a first capacitor having a first input side terminal being connected through a first switch to said first input terminal;

a second capacitor having a second input side terminal being connected through a second switch to said second input terminal;

a data latch circuit being connected to first and second output side terminals of said first and second capacitors, respectively;

a third switch being provided between said first and second input side terminals of said first and second capacitors; and a positive feed-back circuit connected to first and second output side terminals of said first and second capacitors and to an input side of said data latch circuit, wherein after said first and second switches have turned OFF to discontinue applications of said analog input signal voltage and said comparative reference voltage to said first and second capacitors respectively, said third switch turns ON to form a short circuit between said first and second input side terminals of said first and second capacitors.

4. The chopper comparator as claimed in claim 3, wherein said positive feed-back circuit comprises:

a first invertor having an input terminal connected to said first output terminal of said first capacitor and an output terminal connected to said input terminal of the first invertor through a fourth switch;

a second invertor having an input terminal connected to said second output terminal of said second capacitor and an output terminal connected to said input terminal of the second invertor through a fifth switch;

a sixth switch being connected between said input terminal of said first invertor and said output terminal of said second invertor; and a seventh switch being connected between said input terminal of said second invertor and said output terminal of said first invertor.

5. The chopper comparator as claimed in claim 2, further comprising:

a positive feed-back circuit connected to output side terminals of said first and second voltage amplification circuits for positively feeding back variations in potential of said output side terminals of said first and second voltage amplification circuits caused by said short circuit formed between said first and second input side terminals of said first and second capacitors, said positive feed-back circuit also being connected to an input side of said data latch circuit.

6. The chopper comparator as claimed in claim 5, wherein said positive feed-back circuit comprises:

a first invertor having an input terminal connected to said output side terminal of said first voltage amplification circuit and an output terminal connected to said input terminal of the first invertor through a fourth switch;

a second invertor having an input terminal connected to said output side terminal of said second voltage amplification circuit and an output terminal connected to said input terminal of the second invertor through a fifth switch;

a sixth switch being connected between said input terminal of said first invertor and said output terminal of said second invertor; and a seventh switch being connected between said input terminal of said second invertor and said output terminal of said first invertor.

7. A chopper comparator for comparing an analog input signal voltage and a comparative reference voltage, said chopper comparator comprising:

first and second input terminals being provided for receiving said analog input signal voltage and said comparative reference voltage respectively;

a first capacitor having a first input side terminal being connected through a first switch to said first input terminal;

a second capacitor having a second input side terminal being connected through a second switch to said second input terminal;

a positive feed-back circuit connected to first and second output side terminals of said first and second capacitors;

a data latch circuit connected to said positive feed-back circuit; and a third switch being provided between said first and second input side terminals of said first and second capacitors, wherein after said first and second switches have turned OFF to discontinue applications of said analog input signal voltage and said comparative reference voltage to said first and second capacitors respectively, said third switch turns ON to form a short circuit between said first and second input side terminals of said first and second capacitors, and wherein said positive feed-back circuit feeds back variations in potential of first and second output side terminals of said first and second capacitors caused by said short circuit formed between said first and second input side terminals of said first and second capacitors.

8. The chopper comparator as claimed in claim 7, further comprising first and second voltage amplification circuits connected to said first and second output side terminals of said first and second capacitors, respectively, for amplifying voltages which appear on said first and second output side terminals, said first and second voltage amplification circuits also being connected to an input side of said positive feed-back circuit.

9. The chopper comparator as claimed in claim 7, wherein said positive feed-back circuit comprises a first invertor having an input terminal connected to said first output terminal of said first capacitor and an output terminal connected to said input terminal of the first invertor through a fourth switch;

a second invertor having an input terminal connected to said second output terminal of said second capacitor and an output terminal connected to said input terminal of the second invertor through a fifth switch;

a sixth switch being connected between said input terminal of said first invertor and said output terminal of said second invertor; and a seventh switch being connected between said input terminal of said second invertor and said output terminal of said first invertor.

10. A method of sampling voltages with a circuit having first and second capacitors connected respectively to first and second input terminals through first and second switches, comprising the steps of:

receiving first and second input voltages through said first and second input terminals, respectively;

closing first and second switches to supply said first and second voltages to said first and second capacitors, respectively;

opening said first and second switches; and after a predetermined amount of time has elapsed since the step of opening, providing a short circuit connection between the first and second capacitors.

11. The method as claimed in claim 10, wherein the first and second capacitors are connected to each other through a third switch and the step of providing a short circuit includes the step of closing the third switch.

* * * * *